United States Patent
Guo et al.

(10) Patent No.: US 7,840,045 B2
(45) Date of Patent: Nov. 23, 2010

(54) METHOD AND SYSTEM FOR PARALLEL RECONSTRUCTION IN THE K-SPACE DOMAIN FOR APPLICATION IN IMAGING SYSTEMS

(75) Inventors: Junyu Guo, Drexel Hill, PA (US); Eugene G. Kholmovski, Salt Lake City, UT (US); Ling Zhang, Drexel Hill, PA (US); Dennis L. Parker, Salt Lake City, UT (US)

(73) Assignee: The University of Utah Research Foundation, Salt Lake City, UT (US)

( * ) Notice: Subject to any disclaimer, the term of this patent is extended or adjusted under 35 U.S.C. 154(b) by 887 days.

(21) Appl. No.: 11/737,527

(22) Filed: Apr. 19, 2007

(65) Prior Publication Data

US 2008/0175458 A1     Jul. 24, 2008

Related U.S. Application Data

(60) Provisional application No. 60/794,231, filed on Apr. 21, 2006.

(51) Int. Cl.
    *G06K 9/00* (2006.01)
(52) U.S. Cl. ............... 382/128; 382/131; 382/132; 324/307; 324/309
(58) Field of Classification Search ............... 382/128, 382/131, 294, 299, 300; 324/309, 310
See application file for complete search history.

(56) References Cited

U.S. PATENT DOCUMENTS

| | | |
|---|---|---|
| 6,680,610 B1 | 1/2004 | Kyriakos et al. |
| 6,717,406 B2 | 4/2004 | Sodickson |
| 6,828,788 B2 | 12/2004 | Wang |
| 7,002,344 B2 | 2/2006 | Griswold et al. |
| 7,064,547 B1 | 6/2006 | King et al. |
| 7,202,666 B2 | 4/2007 | Wang et al. |
| 7,301,342 B2 * | 11/2007 | Moriguchi et al. ......... 324/309 |
| 7,309,984 B2 * | 12/2007 | Arunachalam et al. ...... 324/307 |
| 7,511,495 B2 * | 3/2009 | Kholmovski et al. ....... 324/310 |
| 7,692,425 B2 * | 4/2010 | Brau et al. ................. 324/309 |
| 2006/0050981 A1 | 3/2006 | Huang |
| 2006/0184000 A1 | 8/2006 | Wang et al. |
| 2006/0208731 A1 | 9/2006 | Wang et al. |
| 2006/0273792 A1 | 12/2006 | Kholmovski et al. |

OTHER PUBLICATIONS

International Search Report for PCT/US 07/67125, mailed Feb. 7, 2008.
Jun-Yu Guo et al., "k-space Inherited Parallel Acquisition (KIPA): application on dynamic magnetic resonance imaging thermometry", Magnetic Resonance Imagining, vol. 24, pp. 903-915, Mar. 1, 2006.

\* cited by examiner

*Primary Examiner*—Tom Y Lu
(74) *Attorney, Agent, or Firm*—Bell & Manning, LLC

(57) ABSTRACT

A method of performing parallel image reconstruction of undersampled image data in k-space. A defined partitioning of a k-space region into a plurality of segments is received. A segment of the plurality of segments is identified wherein data is sampled at less than a Nyquist rate. First imaging data is sampled at the Nyquist rate. A reconstruction coefficient is calculated for at least a portion of the identified segment using the sampled first imaging data. Second imaging data is sampled at less than the Nyquist rate. A value for a missing k-space sample in the identified segment is predicted using the calculated reconstruction coefficient and the sampled second imaging data. An image of the image area is defined using the predicted value and the received second dataset.

20 Claims, 5 Drawing Sheets

METHOD AND SYSTEM FOR PARALLEL RECONSTRUCTION IN THE K-SPACE DOMAIN FOR APPLICATION IN IMAGING SYSTEMS

CROSS-REFERENCE TO RELATED APPLICATIONS

This application claims the benefit of U.S. Provisional Patent Application Ser. No. 60/794,231 that was filed Apr. 21, 2006, the disclosure of which is incorporated by reference in its entirety.

REFERENCE TO GOVERNMENT RIGHTS

This invention was made with United States government support awarded by the following agencies: National Institute of Health Grant Nos. RO1 CA 87785 and RO1 HL 57990. The United States government has certain rights in this invention.

FIELD

The field of the disclosure relates generally to imaging systems. More specifically, the disclosure relates to parallel reconstruction in the k-space domain for application in imaging systems such as magnetic resonance imaging systems.

BACKGROUND

Magnetic resonance imaging (MRI) is an important diagnostic and imaging technique. MRI techniques are based on the absorption and emission of radio frequency (RF) energy by the nuclei of atoms. Typically, a target is placed in a strong magnetic field that causes the generally disordered and randomly oriented nuclear spins of the atoms to become aligned with the applied magnetic field. One or more RF pulses are transmitted into the target, perturbing the nuclear spins. As the nuclear spins relax to their aligned state, the nuclei emit RF energy that is detected by receiving coils disposed about the target. The received RF energy is processed into a magnetic resonance image of a portion of the target.

By utilizing non-uniform magnetic fields having gradients in each of three spatial dimensions, the location of the emitting nuclei can be spatially encoded so that the target can be imaged in three dimensions (3-D). The three dimensions are commonly two mutually orthogonal directions x and y defined in a plane denoted as a "slice" with a series of slices defined in a third mutually orthogonal direction z. As used herein, the x-direction is associated with a frequency-encoding (FE) direction, and the y-direction is associated with a phase-encoding (PE) direction. Generally, RF pulses having a range of frequencies are transmitted into the target, and through use of well-known frequency encoding (e.g., for the x-direction) and phase encoding techniques (e.g., for the y-direction), a set of MRI data is received by each of the receiver coils for each slice in the target.

MRI data provides a representation of the MRI image in the frequency domain, often called k-space domain, where $k_x$ and $k_y$ are the spatial frequency variables in the x and y directions having units of cycles per unit distance. An image of the slice of the target is obtained by performing an inverse Fourier transformation of the k-space MRI data. In MRI systems having multiple receiver coils (parallel MRI), an image is reconstructed from each receiver coil, and a final image is a combination of the images from each coil. Multiple receiver coil systems can be used to achieve high spatial and temporal resolution, to suppress image artifacts, and to reduce MRI scan time.

MRI data can be acquired at the appropriate Nyquist sampling rate to avoid artifacts in the final image caused by aliasing. However, sampling at the Nyquist rate is time consuming, which can prevent the imaging of targets that move, such as a beating heart. To decrease scan time, parallel imaging can be used to exploit a difference in sensitivities between individual coil elements in a receiver array to reduce the total number of PE views that are acquired. A "view" constitutes all of the $k_x$ measurements for a single $k_y$. For the simplest case, a reduction factor of two, the even or odd PE views are skipped relative to the fully sampled k-space.

Skipping every other line of k-space increases the distance of equidistantly sampled k-space lines. If the maximum $k_y$ is unchanged to maintain resolution, an aliased image may be generated from the k-space data. The reduction in the number of PE steps relative to the Nyquist sampling rate is known as undersampling and is characterized by a reduction factor, R. The various undersampling strategies can be divided into two groups, uniform undersampling and non-uniform undersampling. Uniform undersampling uses the equidistantly spaced distributed PE and causes aliasing in the reconstructed image. Non-uniform undersampling, also called variable-density undersampling, generally more densely samples a central region of k-space, and more sparsely samples an outer region. Parallel MRI (P-MRI) undersamples, as compared to the Nyquist sampling rate, by the reduction factor R, which may be 2 or more, to decrease the data acquisition time. The undersampling results in certain data in k-space not being acquired, and therefore not available for image reconstruction. However, dissimilarities in the spatial sensitivities of the multiple receiver coils provide supplementary spatial encoding information, which is known as "sensitivity encoding." A fully sampled set of k-space MRI data can be produced by combining the undersampled, sensitivity-encoded MRI data received by different coils with reconstructed values for the unacquired data to create an image with removed aliasing artifacts.

Coil sensitivities can be used to reconstruct the full-FOV image in the image space domain or in the k-space domain as known to those skilled in the art. In sensitivity encoding (SENSE) reconstruction, coil sensitivity estimates determined from reference scans are applied to reconstruct images from subsequent scans in the image space domain. It is well known that SENSE reconstruction is artifactual when coil sensitivity estimates deviate from the true coil sensitivities due to subject or coil motion between reference and imaging scans. This high sensitivity to error in coil sensitivity estimates is caused by the local nature of SENSE reconstruction. In the conventional SENSE with data sampling on a regular Cartesian grid, reconstruction (de-aliasing) is done independently for each spatial location in the aliased image using local reconstruction coefficients defined by the coil sensitivity values at the corresponding spatial locations.

The scenario is very different for parallel MRI reconstruction techniques such as generalized autocalibrating partially parallel acquisition (GRAPPA) and generalized autocalibrating reconstruction for sensitivity encoded MRI (GARSE) which operate in the k-space domain. These methods utilize only correlations between closely situated k-space locations. Therefore, only low frequency descriptors of coil sensitivities are essential for these methods. Because of the low resolution (low frequency) nature of these descriptors, they can be noticeably altered only by a substantial change in coil or imaged object position. Thus, k-space domain methods for parallel MRI such as GRAPPA and GARSE are less sensitive to motion between reference and imaging scans than SENSE-like techniques.

In GRAPPA, acquired samples in the k-space locations closest to the missing k-space position in the PE direction are used to estimate the value of the missing sample. Such an approach is only optimal when the coil sensitivities can be described by slowly varying functions in image space dependent only on the y-coordinate (PE direction). For real coils used in MRI studies, coil sensitivities are spatially variable in all directions. Thus, GRAPPA provides quality results for low reduction factors, but is less applicable for high reduction factors due to residual aliasing artifacts and substantial noise amplification in the reconstructed images. What is needed, therefore, is a method and a system for parallel reconstruction in the k-space domain which supports high reduction factors and lower noise and artifact levels as compared to existing methods.

SUMMARY

A method and a system for performing parallel image reconstruction of undersampled image data in k-space is provided in an exemplary embodiment. Localized reconstruction coefficients are used to achieve higher reduction factors, and lower noise and artifact levels compared to that of GRAPPA reconstruction. A full k-space dataset for a first frame and a partial k-space dataset for other frames are used to reconstruct a series of images. Reconstruction coefficients calculated for different segments of k-space from the first dataset are used to estimate the missing k-space lines in the corresponding k-space segments of the other frames.

In an exemplary embodiment, a system for performing parallel image reconstruction of undersampled image data in k-space is provided. The system includes, but is not limited to, an imaging apparatus configured to generate first imaging data and second imaging data of an image area, a computer readable medium having computer-readable instructions therein, and a processor operably coupled to the computer-readable medium and configured to execute the instructions. The instructions include receiving a defined partitioning of a k-space region into a plurality of segments; identifying a segment of the plurality of segments wherein data is sampled at less than a Nyquist rate; sampling the generated first imaging data at the Nyquist rate; calculating a reconstruction coefficient for at least a portion of the identified segment using the sampled first imaging data; sampling the identified segment of the generated second imaging data at less than the Nyquist rate; predicting a value for a missing k-space sample in the identified segment using the calculated reconstruction coefficient and the sampled second imaging data; and defining an image of the image area using the predicted value and the sampled second imaging data In an exemplary embodiment, a device for performing parallel image reconstruction of undersampled image data in k-space is provided. The device includes, but is not limited to, a computer-readable medium having computer-readable instructions therein and a processor. The processor is coupled to the computer-readable medium and is configured to execute the instructions. The instructions include receiving a defined partitioning of a k-space region into a plurality of segments; identifying a segment of the plurality of segments wherein data is sampled at less than a Nyquist rate; sampling the first imaging data at the Nyquist rate; calculating a reconstruction coefficient for at least a portion of the identified segment using the sampled first imaging data; sampling the identified segment of the second imaging data at less than the Nyquist rate; predicting a value for a missing k-space sample in the identified segment using the calculated reconstruction coefficient and the sampled second imaging data; and defining an image of the image area using the predicted value and the received second dataset.

In another exemplary embodiment, a method of performing parallel image reconstruction of undersampled image data in k-space is provided. A defined partitioning of a k-space region into a plurality of segments is received. A segment of the plurality of segments is identified wherein data is sampled at less than a Nyquist rate. First imaging data is sampled at the Nyquist rate. A reconstruction coefficient is calculated for at least a portion of the identified segment using the sampled first imaging data. Second imaging data is sampled at less than the Nyquist rate. A value for a missing k-space sample in the identified segment is predicted using the calculated reconstruction coefficient and the sampled second imaging data. An image of the image area is defined using the predicted value and the received second dataset.

In yet another exemplary embodiment, a computer-readable medium is provided. The computer-readable medium has computer-readable instructions therein that, upon execution by a processor, cause the processor to implement the operations of the method of performing parallel image reconstruction of undersampled image data in k-space.

Other principal features and advantages of the invention will become apparent to those skilled in the art upon review of the following drawings, the detailed description, and the appended claims.

BRIEF DESCRIPTION OF THE DRAWINGS

Exemplary embodiments of the invention will hereafter be described with reference to the accompanying drawings, wherein like numerals denote like elements.

DETAILED DESCRIPTION

Figure 1:
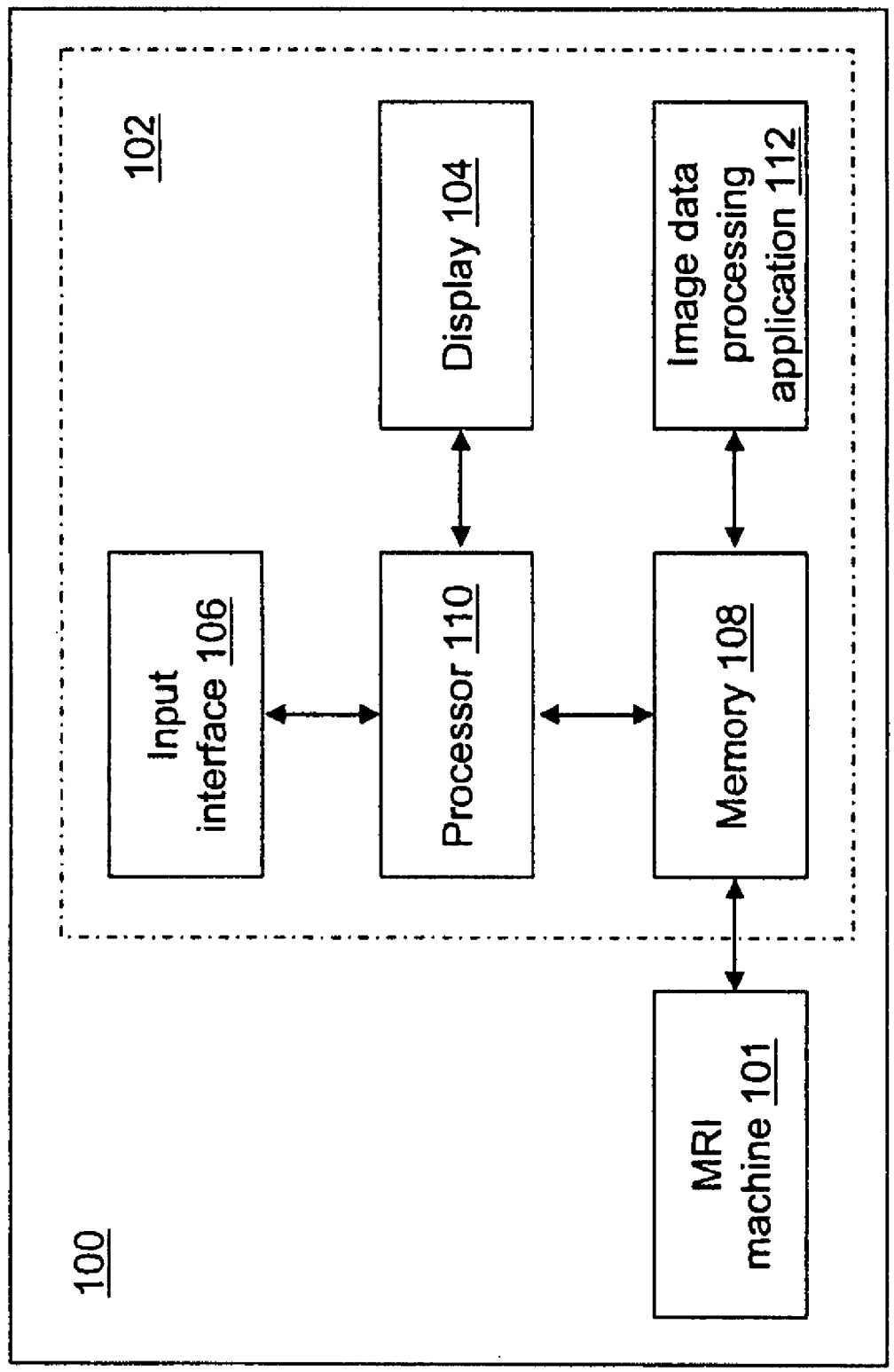
FIG. 1 depicts a block diagram of an MRI data processing system in accordance with an exemplary embodiment.

With reference to FIG. 1, a block diagram of an MRI data processing system 100 is shown in accordance with an exemplary embodiment. MRI data processing system 100 may include a magnetic resonance imaging (MRI) apparatus 101 and a computing device 102. Computing device 102 may include a display 104, an input interface 106, a memory 108, a processor 110, and an image data processing application 112. In the embodiment illustrated in FIG. 1, MRI machine 101 generates MRI image data.

Computing device 102 may be a computer of any form factor. Different and additional components may be incorporated into computing device 102. Components of MRI data processing system 100 may be positioned in a single location, a single facility, and/or may be remote from one another. As a result, computing device 102 may also include a communication interface, which provides an interface for receiving and transmitting data between devices using various protocols, transmission technologies, and media as known to those skilled in the art. The communication interface may support communication using various transmission media that may be wired or wireless.

Display 104 presents information to a user of computing device 102 as known to those skilled in the art. For example, display 104 may be a thin film transistor display, a light emitting diode display, a liquid crystal display, or any of a variety of different displays known to those skilled in the art now or in the future.

Input interface 106 provides an interface for receiving information from the user for entry into computing device 102 as known to those skilled in the art. Input interface 106 may use various input technologies including, but not limited to, a keyboard, a pen and touch screen, a mouse, a track ball, a touch screen, a keypad, one or more buttons, etc. to allow the user to enter information into computing device 102 or to make selections presented in a user interface displayed on display 104. Input interface 106 may provide both an input and an output interface. For example, a touch screen both allows user input and presents output to the user.

Memory 108 is an electronic holding place or storage for information so that the information can be accessed by processor 110 as known to those skilled in the art. Computing device 102 may have one or more memories that use the same or a different memory technology. Memory technologies include, but are not limited to, any type of RAM, any type of ROM, any type of flash memory, etc. Computing device 102 also may have one or more drives that support the loading of a memory media such as a compact disk or digital video disk.

Processor 110 executes instructions as known to those skilled in the art. The instructions may be carried out by a special purpose computer, logic circuits, or hardware circuits. Thus, processor 110 may be implemented in hardware, firmware, software, or any combination of these methods. The term "execution" is the process of running an application or the carrying out of the operation called for by an instruction. The instructions may be written using one or more programming language, scripting language, assembly language, etc. Processor 110 executes an instruction, meaning that it performs the operations called for by that instruction. Processor 110 operably couples with display 104, with input interface 106, with memory 108, and with the communication interface to receive, to send, and to process information. Processor 110 may retrieve a set of instructions from a permanent memory device and copy the instructions in an executable form to a temporary memory device that is generally some form of RAM. Computing device 102 may include a plurality of processors that use the same or a different processing technology.

Image data processing application 112 performs operations associated with performing parallel image reconstruction of undersampled image data in k-space. Some or all of the operations subsequently described may be embodied in image data processing application 112. The operations may be implemented using hardware, firmware, software, or any combination of these methods. With reference to the exemplary embodiment of FIG. 1, image data processing application 112 is implemented in software stored in memory 108 and accessible by processor 110 for execution of the instructions that embody the operations of image data processing application 112. Image data processing application 112 may be written using one or more programming languages, assembly languages, scripting languages, etc.

MRI machine 101 and computing device 102 may be integrated into a single system such as an MRI machine. MRI machine 101 and computing device 102 may be connected directly. For example, MRI machine 101 may connect to computing device 102 using a cable for transmitting information between MRI machine 101 and computing device 102. MRI machine 101 may connect to computing device 102 using a network. MRI images may be stored electronically and accessed using computing device 102. MRI machine 101 and computing device 102 may not be connected. Instead, the MRI data acquired using MRI machine 101 may be manually provided to computing device 102. For example, the MRI data may be stored on electronic media such as a CD or a DVD. After receiving the MRI data, computing device 102 may initiate processing of the set of images that comprise an MRI study. In an exemplary embodiment, MRI machine 101 is a three Tesla Trio Magnetom MRI scanner manufactured by Siemens Medical Solutions, Erlangen, Germany using an eight-channel head coil manufactured by Medical Devices, Waukesha, Wis. MRI machines of a different type, manufacture, and model may be used in alternative embodiments without limitation.

Figure 2:
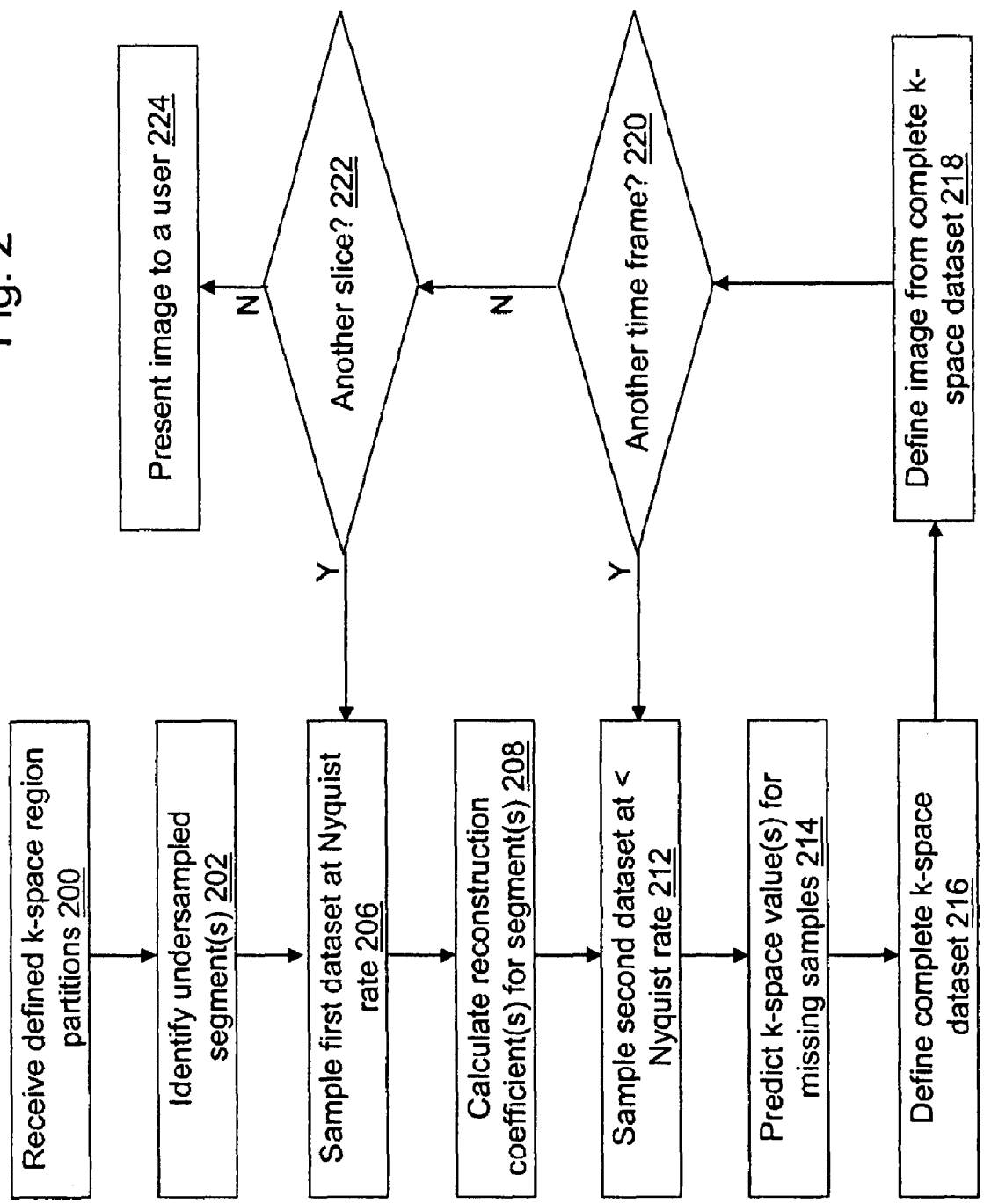
FIG. 2 depicts a flow diagram illustrating exemplary operations performed by the MRI data processing system of FIG. 1 in accordance with an exemplary embodiment.
Figure 3:
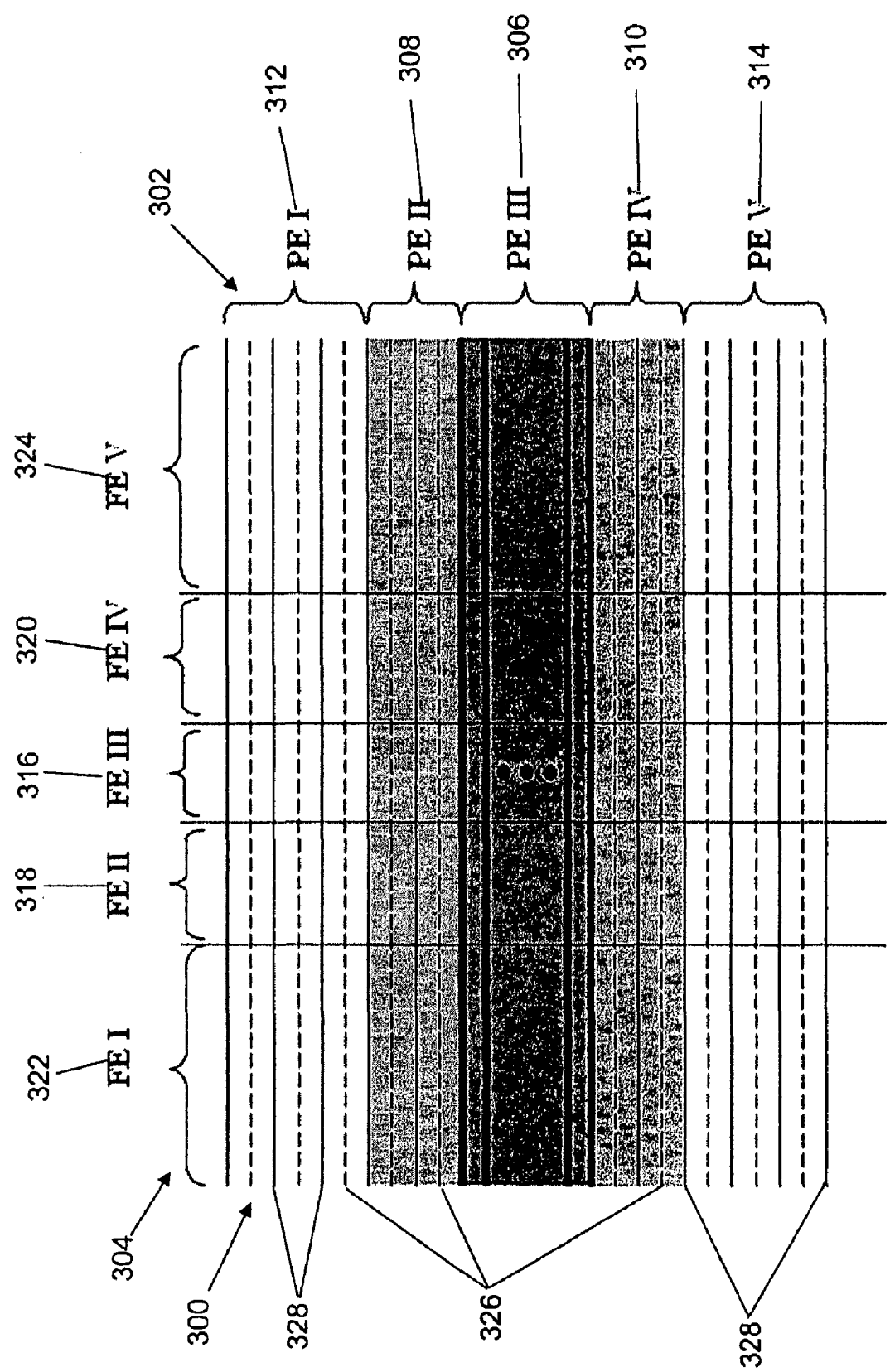
FIG. 3 depicts a graph illustrating two-dimensional (2-D) segmentation of an image area in k-space in accordance with an exemplary embodiment.

With reference to FIG. 2, exemplary operations associated with image data processing application 112 of FIG. 1 are described. Additional, fewer, or different operations may be performed, depending on the embodiment. In an operation 200, a defined partitioning of a k-space region into a plurality of segments is received. The defined partitioning may be defined by a user, for example, using input interface 106 or pre-defined in image data processing application 112. In an operation 202, one or more undersampled segments (i.e., sampled at less than the Nyquist rate) are identified from the plurality of segments. For example, with reference to FIG. 3, a k-space segmentation 300 is illustrated. In the exemplary embodiment of FIG. 3, there are five segments in a PE direction 302 and five segments in an FE direction 304. There may be a greater or a lesser number of segments in PE direction 302 and in FE direction 304. The five segments in PE direction 302 include a central PE segment 306. The remaining four segments are defined on a first side of central PE segment 306 and a second side of central PE segment 306, which is opposite the first side. Thus, a first PE segment 308 is indicated on the first side of central PE segment 306 and a second PE segment 310 is indicated on the second side of central PE segment 306. Additionally, a third PE segment 312 is indicated adjacent to the first PE segment 308 on the first side of central PE segment 306 and a fourth PE segment 314 is indicated adjacent to the second PE segment 310 on the second side of central PE segment 306. In an exemplary embodiment, the PE segments 306, 308, 310, 312, 314 have a variable width in the PE direction. In an exemplary embodiment, the width of the PE segments 306, 308, 310, 312, 314 increases from a low to a high spatial frequency in the PE direction. In the example shown, the widths of the PE segments 306, 308, 310, 312, 314 are 10%, 15%, 15%, 30%, and 30% of the frequency coverage in the PE direction, respectively.

The five segments in FE direction 304 include a central FE segment 316. The remaining four segments are defined on a first side of central FE segment 316 and a second side of central FE segment 316, which is opposite the first side. Thus, a first FE segment 318 is indicated on the first side of central FE segment 316 and a second FE segment 320 is indicated on the second side of central FE segment 316. Additionally, a third FE segment 322 is indicated adjacent first FE segment 318 on the first side of central FE segment 316 and a fourth FE segment 324 is indicated adjacent second FE segment 320 on the second side of central FE segment 316. In an exemplary embodiment, the FE segments 316, 318, 320, 322, 324 have a variable width in the FE direction. In an exemplary embodiment, the width of the FE segments 316, 318, 320, 322, 324 increases from a low to a high spatial frequency in the FE direction. In the example shown, the widths of the FE segments 316, 318, 320, 322, 324 are 10%, 15%, 15%, 30%, and 30% of the frequency coverage, respectively. As a result, in the exemplary embodiment of FIG. 3, the entire k-space of the image area is divided into 25 segments in which the area increases from low to high spatial frequency. An arbitrary number of segments can be defined in all imaging directions.

In an exemplary embodiment, all of the k-space lines in central PE segment 306 are acquired for each time frame. However, only a fraction of the PE lines in PE segments 308, 310, 312, 314 may be acquired for some time frames. Thus, the data in PE segments 308, 310, 312, 314 is sampled at less than a Nyquist rate. The sampling at less than a Nyquist rate may correspond with a reduction factor of 2, 3, 4, 5, 6, etc. In the exemplary embodiment of FIG. 3, a reduction factor of 2 is applied to PE segments 308, 310, 312, 314. Missing lines 326 are denoted using dashed lines, and acquired lines 328 are denoted using solid lines. The same or a different reduction factor may be used in PE segments 308, 310, 312, 314. In an exemplary embodiment, the k-space segmentation scheme for the second and subsequent time frames is the same.

With continuing reference to FIG. 2, in an operation 206, one or more first image datasets is received and sampled at least at the Nyquist sampling rate to define a complete k-space dataset for an entire image area. In an operation 208, reconstruction coefficients are calculated for the undersampled k-space segment(s) using the complete k-space dataset in order to adapt the reconstruction coefficients to the local SNR characteristics of the k-space regions. In the exemplary embodiment of FIG. 3, the undersampled segments are PE segments 308, 310, 312, 314. The k-space reconstruction coefficients may be calculated for each undersampled k-space segment of the image area using a pseudo inverse of a truncated GARSE kernel with a reduced number of points as represented by $$S_i^n(k_x, k_y + m\Delta k_y) = \sum_{j=1}^{N_c} \sum_{q=1}^{N_b} w(n, i, j, m, q) S_j(k_x + a_q\Delta k_x, k_y + b_q\Delta k_y)$$

where n is a segment number of the identified segment, i is a coil number, m is a first offset of the missing k-space sample from an acquired sample in the identified segment of the transformed second imaging data in the PE direction, $k_x$ is the index of the missing k-space sample in a frequency-encoding direction, $k_y$ is the index of the missing k-space sample in a phase-encoding direction, $\Delta k_x$ is the spacing between k-space measurements at the Nyquist rate in the frequency-encoding direction, $\Delta k_y$ is the spacing between k-space measurements at the Nyquist rate in the phase-encoding direction, $N_c$ is a number of receiver coils, w(n, i, j, m, q) is a reconstruction coefficient obtained for coil number i, for segment number n, and for first offset m, and $S_j(k_x+a_q\Delta k_x, k_y+b_q\Delta k_y)$ is a k-space signal in segment number n of coil number i at a point ($k_x+a_q\Delta k_x, k_y+b_q\Delta k_y$). Indexes $a_q$ and $b_q$ count through the number of $N_b$ blocks included in the reconstruction. In an exemplary embodiment, a Moore-Penrose pseudo-inverse is used.

Figure 4:
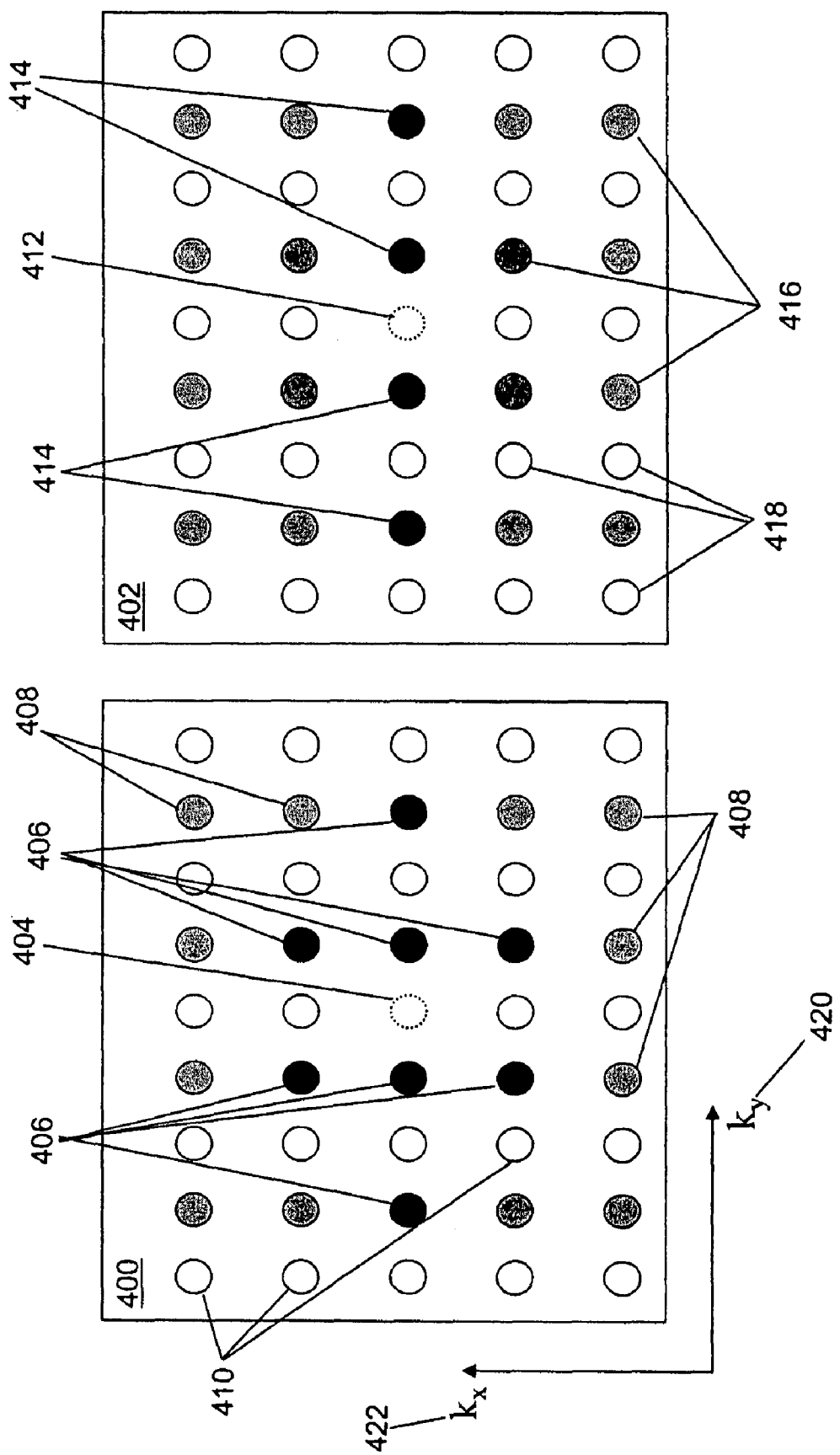
FIG. 4 depicts a graph illustrating two-dimensional (2-D) processing of an image area in k-space to reconstruct a missing k-space value in accordance with an exemplary embodiment and in accordance with GRAPPA.

With reference to FIG. 4, a two-dimensional (2-D) processing of a k-space dataset 400 to reconstruct a value of k-space point 404 is shown in accordance with an exemplary embodiment. A processing of a k-space dataset 402 to reconstruct a value of k-space point 412 is also shown in accordance with a conventional GRAPPA algorithm. K-space dataset 400 includes k-space point 404 to recover, utilized k-space points 406, acquired k-space points 408, and missing k-space points 410. In the exemplary embodiment of FIG. 4, a reduction factor of two is indicated in the PE direction 420. The combination of $a_q$ and $b_q$ sequences through utilized k-space points 406, which includes eight acquired k-space samples surrounding missing k-space point 404. K-space dataset 402 includes k-space point 412 to recover, utilized k-space points 414, acquired k-space points 416, and missing k-space points 418. Using a conventional GRAPPA algorithm, the index q sequences through utilized k-space points 414 which includes four points. For the segmentation scheme shown in FIG. 3, twenty sets of reconstruction coefficients are calculated with one set for each undersampled segment because all of the k-space lines for central PE segment 306 are acquired in each time frame.

With continuing reference to FIG. 2, in an operation 212, a second image dataset is received and sampled at less than the Nyquist sampling rate to define a partial k-space dataset for the image area. The partial k-space dataset is undersampled based on the reduction factor. In an operation 214, a k-space value for each missing sample of the identified undersampled segments is predicted. For example, the missing k-space data can be recovered according to the GARSE algorithm $$S_i(\hat{k}) = \sum_{j=1}^{N_c} \sum_{\tilde{k} \in \Omega_j(\hat{k})} w(i, j, \tilde{k}) S_j(\tilde{k}),$$

where $S(\tilde{k})$ denotes the k-space acquired data, $S(\hat{k})$ denotes the k-space missing data, w are the calculated reconstruction coefficients, and $N_c$ is the number of coils. $\Omega_j(\hat{k})$ denotes a set of the sampled k-space locations inside the j-th coil sensitivity kernel centered at $\hat{k}$ that are used to predict the measurement at $\hat{k}$. $\Omega_j(\hat{k})$ is defined by the imaging geometry, coil characteristics, and reduction factor of the imaging study.

More specifically, the missing k-space data can be recovered using a truncated GARSE kernel with a reduced number of points according to $$S_i^n(k_x, k_y + m\Delta k_y) = \sum_{j=1}^{N_c} \sum_{q=1}^{N_b} w(n, i, j, m, q) S_j(k_x + a_q\Delta k_x, k_y + b_q\Delta k_y)$$

where n is a segment number of the identified segment, i is a coil number, m is an offset of the missing k-space sample from an acquired sample in the identified segment of the transformed second imaging data, $k_x$ is the index of the missing k-space sample in a frequency-encoding direction, $k_y$ is the index of the missing k-space sample in a phase-encoding direction, $\Delta k_x$ is the spacing between k-space measurements at the Nyquist rate in the frequency-encoding direction, $\Delta k_y$ is the spacing between k-space measurements at the Nyquist rate in the phase-encoding direction, $N_c$ is a number of receiver coils, w(n, i, j, m, q) is a reconstruction coefficient obtained for coil number i, for segment number n, and for first offset m, and $S_j(k_x+a_q\Delta k_x, k_y+b_q\Delta k_y)$ is a k-space signal in segment number n of coil number i at a point ($k_x+a_q\Delta k_x, k_y+b_q\Delta k_y$). The indexes $a_q$ and $b_q$ count through the number of $N_b$ blocks included in the reconstruction. The reconstruction coefficients, w(n, i, j, m, q) calculated in operation 204 are used in addition to the utilized k-space points 406 of the second image dataset to reconstruct the missing k-space data point of the corresponding segment. In this manner, the complete k-space data is constructed. In an operation 216, a complete k-space dataset is defined using the predicted k-space values and the partial k-space dataset. In an operation 218, an image is defined from the complete k-space data. For example, an inverse Fourier transform is applied to the complete k-space data to define the image in image space for presentation to a user for example, using display 104, as known to those skilled in the art.

In an operation 220, a determination is made concerning whether or not an additional time frame is available for processing. If an additional time frame is available for processing, processing continues at operation 210 with a second image dataset associated with the additional time frame. If an additional time frame is not available for processing, processing continues at an operation 222. In operation 222, a determination is made concerning whether or not an additional slice of data is available for processing. If an additional slice of data is available for processing, processing continues at operation 204 with a first image dataset associated with the additional slice of data. If an additional slice of data is not available for processing, the defined images may be presented to a user of computing device 102 in an operation 224.

The order of presentation of the operations of FIG. 2 is not intended to be limiting. For example, multiple time frames and multiple slices may be processed in a different sequence. As another example, presentation of the images to the user may be performed in a different sequence. The defined images also may be stored to memory 108.

The reconstruction coefficients are computed from a fully-sampled k-space data of the image area in a dynamic sequence and are applied to calculate the missing measurements in other frames. The k-space may be divided into a number of segments in one or more of the available imaging directions and reconstruction coefficients evaluated independently for each segment. Because the reconstruction coefficients are determined from a fully sampled dataset, there is complete generality in how the k-space can be divided into segments for reconstruction coefficient determination. There is also complete generality in which lines are omitted from acquisition in subsequent k-space frames allowing uniform and variable density undersampling. In one possible implementation, one global set of reconstruction coefficients is computed from the complete k-space data. Because the reconstruction coefficients are not used to predict the central fully sampled lines of k-space, those lines can be omitted from the determination of the global set of reconstruction coefficients.

Experiments were performed on a three Tesla MRI Trio Magnetom scanner (Siemens Medical Solutions, Erlangen, Germany) using an eight-channel head coil (Medical Devices, Waukesha, Wis.). Data was acquired using an RF spoiled GRE pulse sequence with TR=40 milliseconds (ms), FOV=256 millimeters (mm), an imaging matrix=256×256, a flip angle=25°, and an acquisition time=12 sec per image. TE was equal to 10 ms. The raw data (measurement data on the Siemens Trio) was saved and used to reconstruct images and to calculate the image phase (and corresponding temperature) distribution using MATLAB (MathWorks, Natick, Mass.). To obtain the temperature map, the phase difference image between two adjacent time frames was calculated using complex subtraction as $$\Delta\phi = \phi_1 - \phi_2 = \tan^{-1}\frac{R_2 I_1 - R_1 I_2}{R_1 R_2 + I_1 I_2}$$

where $\Delta\phi$ is the phase difference and $\phi_i$ is the phase image of the $i^{th}$ frame. $R_i$ and $I_i$ are the real and imaginary parts of the $i^{th}$ image. The temperature map was calculated using the phase difference as $$\Delta T = \frac{\Delta\phi}{2\pi \cdot \gamma \cdot \alpha \cdot B_0 \cdot TE}$$

where $\Delta\phi$ is the phase change in radians, $\Delta T$ is the temperature change in °C., TE is the echo time in seconds, $\gamma$ is the proton gyromagnetic ratio (42.58 MHz/T), and $\alpha$ is the thermal coefficient of the PRF shift (−0.01 ppm/° C.). These temperature changes were accumulated to form a relative temperature change profile using the first sampling point as the reference.

Computer simulations were performed to study the performance of the operations discussed with reference to FIG. 2 for contrast-enhanced imaging. A set of computer generated images containing a circular object with a number of fine structure lines was created. The intensity of the structures was varied from image to image to simulate the contrast enhancement process. Eight coil sensitivity maps were modeled using identical Gaussian functions and the coils were assumed to be uniformly distributed around the circular object. Noise-free images for the eight coils were generated by multiplying the phantom images by the corresponding sensitivity maps. Complex Gaussian noise, with a standard deviation equal to ten percent of the averaged intensity of the circular object, was added to the eight individual coil images. The noise was generated independently for each coil image. The k-space data set was constructed from the images. The GRAPPA method used for comparison was implemented using four blocks (the closest neighbors in PE direction), and sliding reconstruction was not used.

Figure 5:
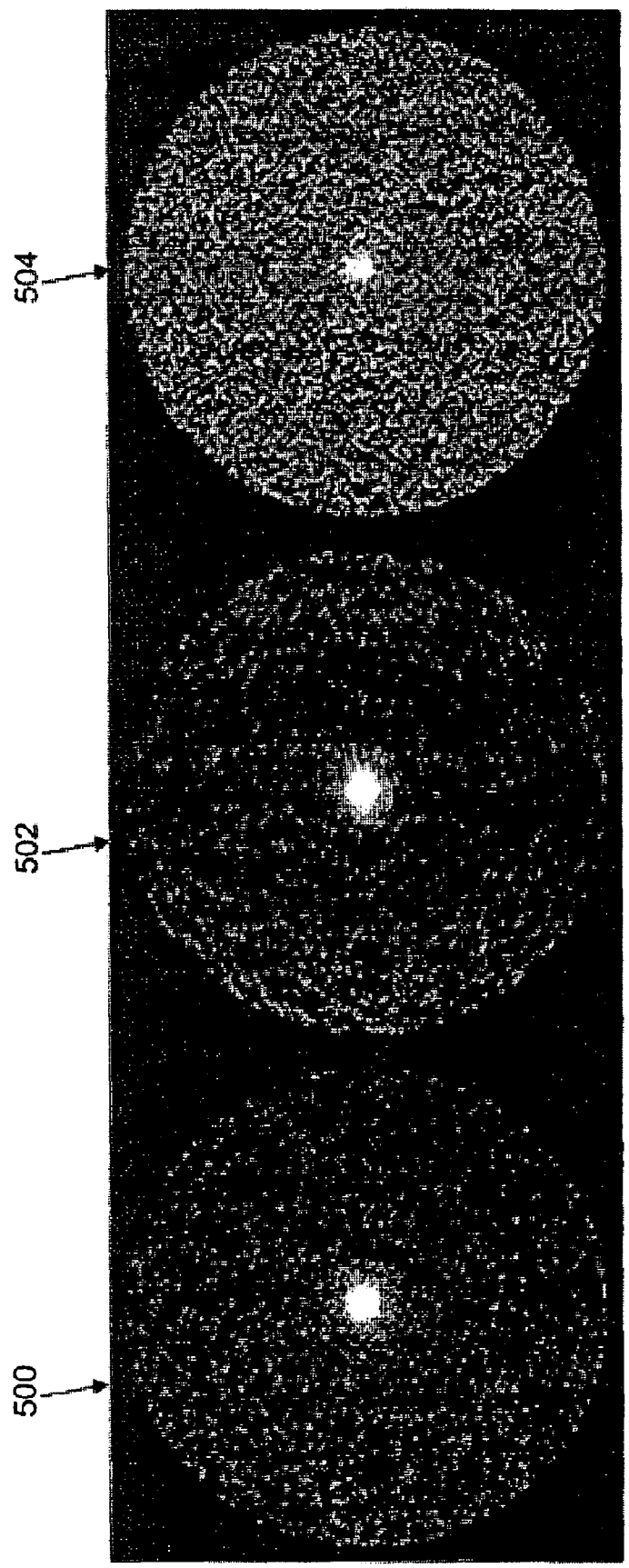
FIG. 5 depicts graphs illustrating phase difference images of a phantom heated with ultrasound using a complete dataset, using an exemplary embodiment, and using conventional GRAPPA.

In an exemplary experiment, thirty time frames were acquired to monitor temperature changes during heating and cooling. After the first three frames were acquired as temperature reference frames, an agar phantom was heated by an ultrasound transducer. The ultrasound was turned on at the fourth frame and off at the twenty-first frame. Complete k-space data sets were acquired for all frames to allow comparison with the under-sampled data sets extracted from the complete data. For comparison, the second frame was chosen as a reference frame. The difference in phase between the reference frame image and the images from the twenty-first frame were obtained using the different data acquisition schemes and image reconstruction methods. With reference to FIG. 5, a first phase difference image 500 was constructed using the complete k-space data set. A second phase difference image 502 was constructed using the provided method and a reduction factor of six. A third phase difference image 504 was constructed using the GRAPPA algorithm and a reduction factor of four. The noise indicated in second image 502 is similar to that of first image 500. The noise indicated in third image 504 is much greater than that in second image 502 even with a smaller reduction factor.

Additional experimental results have demonstrated that, for dynamic parallel imaging, especially with high reduction factors, the image quality is largely improved using the provided method relative to the conventional GRAPPA method. Specifically, noise amplification and unresolved aliasing, which are major concerns for parallel MRI with high reduction factors, are substantially reduced using the provided method instead of GRAPPA even with a reduction factor of six and an eight-channel coil.

For dynamic MRI applications such as MRIT, the provided method is more computationally efficient than GRAPPA because the reconstruction coefficients are calculated only once from the data in the first frame, and are used to recover the missing k-space lines for the remaining time frames. Thus, the provided method requires time consuming matrix inversion only for the first frame; whereas, GRAPPA requires the matrix inversion operation for each time frame.

The segmentation scheme for the provided method is completely arbitrary as it is applied to fully sampled data from the reference frame. The main justification for the segmentation is to include a dependence on the k-space energy distribution, but each segment should include an adequate number of points to allow reliable estimation of the reconstruction coefficients. Segmentation in circular rings for 2-D and spherical shells for 3-D may be utilized to more appropriately reflect the k-space energy distribution.

Using the provided method, real time, multi-slice or 3-D temperature mapping is feasible and may be useful for dynamic control of thermal interventional procedures, such as high intensity focused ultrasound (HIFU). As implemented, dynamic imaging is achieved by omitting the same sets of k-space lines in every frame. This simplifies the initial set-up because the same sets of reconstruction coefficients are applied to each dynamic frame in the sequence. It is, however, possible to implement dynamic imaging such that different sets of k-space lines are acquired in each dynamic image. Although this requires different sets of reconstruction coefficients for each set of missing k-space lines, the interleaved acquisition has the advantage that a fully sampled set of k-space can be constructed at any intermediate time point during the dynamic sequence and can be used to periodically refresh the reconstruction coefficients for subsequent time frames. Such an implementation may be more robust to changes in the imaged object structure and position though less computationally efficient.

The word "exemplary" is used herein to mean serving as an example, instance, or illustration. Any aspect or design described herein as "exemplary" is not necessarily to be construed as preferred or advantageous over other aspects or designs. Further, for the purposes of this disclosure and unless otherwise specified, "a" or "an" means "one or more". The exemplary embodiments may be implemented as a method, apparatus, or article of manufacture using standard programming and/or engineering techniques to produce software, firmware, hardware, or any combination thereof to control a computer to implement the disclosed embodiments. The term "computer readable medium" can include, but is not limited to, magnetic storage devices (e.g., hard disk, floppy disk, magnetic strips, . . . ), optical disks (e.g., compact disk (CD), digital versatile disk (DVD), . . . ), smart cards, flash memory devices, etc. Additionally, it should be appreciated that a carrier wave can be employed to carry computer-readable media such as those used in transmitting and receiving electronic mail or in accessing a network such as the Internet or a local area network (LAN).

The foregoing description of exemplary embodiments of the invention have been presented for purposes of illustration and of description. It is not intended to be exhaustive or to limit the invention to the precise form disclosed, and modifications and variations are possible in light of the above teachings or may be acquired from practice of the invention. The functionality described may be implemented in a single executable or application or may be distributed among modules that differ in number and distribution of functionality from those described herein. Additionally, the order of execution of the functions may be changed depending on the embodiment. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A system for performing parallel image reconstruction of undersampled image data in k-space, the system comprising:

an imaging apparatus configured to generate first imaging data of an image area and to generate second imaging data of the image area;

a computer-readable medium having computer-readable instructions therein, the instructions comprising receiving a defined partitioning of a k-space region into a plurality of segments;

identifying a segment of the plurality of segments wherein data is sampled at less than a Nyquist rate;

sampling the generated first imaging data at the Nyquist rate;

calculating a reconstruction coefficient for at least a portion of the identified segment using the sampled first imaging data;

sampling the identified segment of the generated second imaging data at less than the Nyquist rate;

predicting a value for a missing k-space sample in the identified segment using the calculated reconstruction coefficient and the sampled second imaging data; and defining an image of the image area using the predicted value and the sampled second imaging data; and a processor operably coupled to the computer-readable medium and configured to execute the instructions.

2. A non-transitory computer-readable medium having computer-readable instructions therein that, upon execution by a processor, cause the processor to perform parallel image reconstruction of undersampled image data in k-space, the instructions comprising:

receiving a defined partitioning of a k-space region into a plurality of segments;

identifying a segment of the plurality of segments wherein data is sampled at less than a Nyquist rate;

sampling the first imaging data at the Nyquist rate;

calculating a reconstruction coefficient for at least a portion of the identified segment using the sampled first imaging data;

sampling the identified segment of the second imaging data at less than the Nyquist rate;

predicting a value for a missing k-space sample in the identified segment using the calculated reconstruction coefficient and the sampled second imaging data; and defining an image of the image area using the predicted value and the received second dataset.

3. A method of performing parallel image reconstruction of undersampled image data in k-space, the method comprising:
   (a) receiving, at a computing device, a defined partitioning of a k-space region into a plurality of segments;
   (b) identifying, by the computing device, a segment of the plurality of segments wherein data is sampled at less than a Nyquist rate;
   (c) sampling, by the computing device, the first imaging data at the Nyquist rate;
   (d) calculating, by the computing device, a reconstruction coefficient for at least a portion of the identified segment using the sampled first imaging data;
   (e) sampling, by the computing device, the identified segment of the second imaging data at less than the Nyquist rate;
   (f) predicting, by the computing device, a value for a missing k-space sample in the identified segment using the calculated reconstruction coefficient and the sampled second imaging data; and
   (g) defining, by the computing device, an image of the image area using the predicted k-space value and the received second dataset.

4. The non-transitory computer-readable medium of claim 2, further comprising repeating (a)-(g) for a plurality of timeframes.

5. The non-transitory computer-readable medium of claim 2, wherein calculating the reconstruction coefficient uses a portion of the sampled first imaging data corresponding to the identified segment.

6. The non-transitory computer-readable medium of claim 2, wherein the segment comprises a plurality of identified segments.

7. The non-transitory computer-readable medium of claim 6, wherein sampling of the plurality of identified segments at less than the Nyquist rate is uniform across the plurality of identified segments.

8. The non-transitory computer-readable medium of claim 6, wherein sampling of the plurality of identified segments at less than the Nyquist rate is variable across the plurality of identified segments.

9. The non-transitory computer-readable medium of claim 2, wherein the plurality of segments are defined in a phase-encoding direction or in a frequency encoding direction.

10. The non-transitory computer-readable medium of claim 2, wherein the plurality of segments are defined in a phase-encoding direction and in a frequency encoding direction.

11. The non-transitory computer-readable medium of claim 10, wherein the plurality of segments are defined into a first segment on a first side of a central phase-encoding segment and a second segment on a second side of the central phase-encoding segment, wherein the second side is opposite the first side.

12. The non-transitory computer-readable medium of claim 11, wherein the plurality of segments are defined into a third segment on a third side of a central frequency-encoding segment and a fourth segment on a fourth side of the central frequency-encoding segment, wherein the fourth side is opposite the third side.

13. The non-transitory computer-readable medium of claim 11, wherein sampling of the central phase-encoding segment is at a rate that is greater than or equal to the Nyquist rate.

14. The non-transitory computer-readable medium of claim 13, wherein the central phase-encoding segment of the second imaging data is not used to predict the value.

15. The non-transitory computer-readable medium of claim 10, wherein the plurality of segments are defined into a first plurality of segments on a first side of a central phase-encoding segment and a second plurality of segments on a second side of the central phase-encoding segment, wherein the second side is opposite the first side.

16. The non-transitory computer-readable medium of claim 15, wherein a width of the first plurality of segments increases from a low to a high spatial frequency in the phase-encoding direction.

17. The non-transitory computer-readable medium of claim 15, wherein the plurality of segments are defined into a third plurality of segments on a third side of a central frequency-encoding segment and a fourth plurality of segments on a fourth side of the central frequency-encoding segment, wherein the fourth side is opposite the third side.

18. The non-transitory computer-readable medium of claim 17, wherein a width of the third plurality of segments increases from a low to a high spatial frequency in the frequency-encoding direction.

19. The non-transitory computer-readable medium of claim 6, wherein predicting the value for the identified segment comprises $$S_i^n(k_x, k_y + m\Delta k_y) = \sum_{j=1}^{N_c} \sum_{q=1}^{N_b} w(n, i, j, m, q) S_j(k_x + a_q \Delta k_x, k_y + b_q \Delta k_y)$$

where n is a segment number of the identified segment, i is a coil number, m is a first offset of the missing k-space sample from an acquired sample in the identified segment of the second imaging data, $k_x$ is a first index of the missing k-space sample in a frequency-encoding direction, $k_y$ is a second index of the missing k-space sample in a phase-encoding direction, $\Delta k_x$ is a first spacing between k-space measurements at the Nyquist rate in the frequency-encoding direction, $\Delta k_y$ is a second spacing between k-space measurements at the Nyquist rate in the phase-encoding direction, a first index $a_q$ and a second index $b_q$ count through a number of blocks $N_b$ included in a reconstruction, $N_c$ is a number of receiver coils, $w(n, i, j, m, q)$ is a reconstruction coefficient obtained for coil number i, for segment number n, and for first offset m, and $S_j(k_x+a_q\Delta k_x, k_y+b_q\Delta k_y)$ is a k-space signal in segment number n of coil number i at a point $(k_x+a_q\Delta k_x, k_y+b_q\Delta k_y)$.

20. The non-transitory computer-readable medium of claim 19, wherein calculating the reconstruction coefficient comprises solving $$S_i^n(k_x, k_y + m\Delta k_y) = \sum_{j=1}^{N_c} \sum_{q=1}^{N_b} w(n, i, j, m, q) S_j(k_x + a_q \Delta k_x, k_y + b_q \Delta k_y)$$

for the reconstruction coefficient, $w(n, i, j, m, q)$ using a Moore-Penrose pseudo-inverse.

* * * * *